United States Patent
Lewis et al.

[11] Patent Number: 5,476,679
[45] Date of Patent: Dec. 19, 1995

[54] METHOD FOR MAKING A GRAPHITE COMPONENT COVERED WITH A LAYER OF GLASSY CARBON

[75] Inventors: Irwin C. Lewis, Strongsville; Terrence A. Pirro, Cleveland; Douglas J. Miller, North Olmsted, all of Ohio

[73] Assignee: UCAR Carbon Technology Corporation, Danbury, Conn.

[21] Appl. No.: 434,495

[22] Filed: May 4, 1995

Related U.S. Application Data

[63] Continuation of Ser. No. 210,654, Mar. 18, 1994, abandoned, which is a continuation of Ser. No. 751,966, Aug. 29, 1991, abandoned.

[51] Int. Cl.[6] ........................................ B05D 5/12
[52] U.S. Cl. .................. 427/122; 427/228; 427/430.1
[58] Field of Search ................................. 427/122, 228, 427/430.1

[56] References Cited

U.S. PATENT DOCUMENTS

| | | | |
|---|---|---|---|
| 3,238,054 | 3/1966 | Bickerdike et al. | 427/122 |
| 3,406,044 | 10/1968 | Harris | 117/215 |
| 3,628,984 | 12/1971 | Ishikawa et al. | 117/46 CC |
| 3,682,686 | 8/1972 | Nakamura et al. | 427/228 |
| 4,159,891 | 7/1979 | Schmidt et al. | 373/72 |
| 4,554,024 | 11/1985 | Zimmer et al. | 427/227 |
| 4,621,017 | 11/1986 | Chandler et al. | 428/328 |
| 4,888,242 | 12/1989 | Matsuo et al. | 373/72 |
| 5,043,185 | 8/1991 | Murakami et al. | 427/227 |

*Primary Examiner*—Benjamin Utech
*Attorney, Agent, or Firm*—F. J. McCarthy

[57] ABSTRACT

Method for making a component, graphite component, such as a graphite crucible, for use in the production of silicon crystal growth from molten silicon wherein the graphite component has an outer coated layer of glassy carbon formed from a thermoset organic resin that prevents contamination of the molten silicon by carbon from the graphite component.

1 Claim, 1 Drawing Sheet

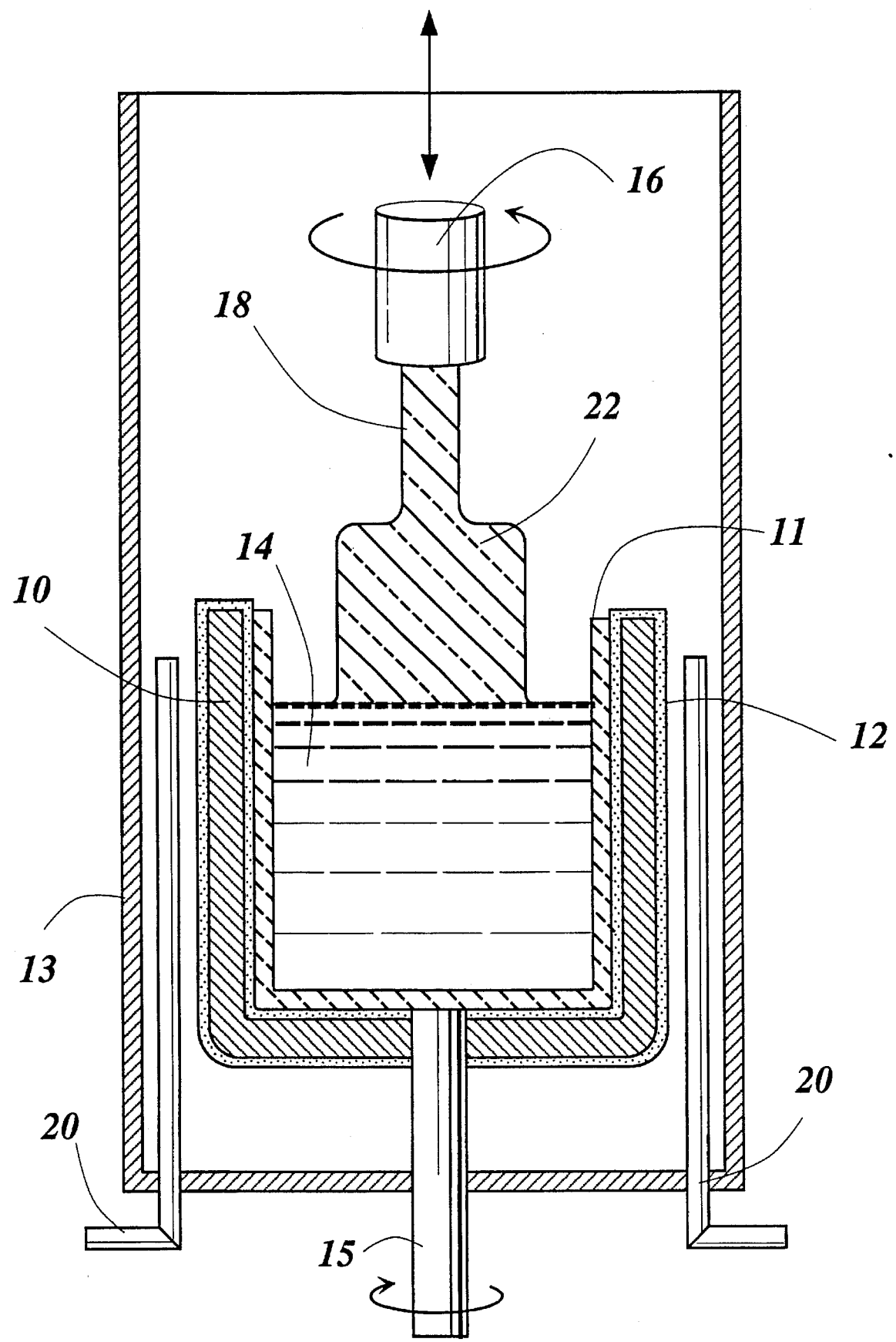

METHOD FOR MAKING A GRAPHITE COMPONENT COVERED WITH A LAYER OF GLASSY CARBON

This application is a continuation of prior U.S. application Ser. No. 08/210,654 Mar. 18, 1994 now abandoned and which is a continuation of application Ser. No. 07/751,966 filing date Aug. 29, 1991, now abandoned.

BACKGROUND OF THE INVENTION

1. Field of the Invention

This invention pertains to the field of producing substantially carbon-free silicon for semiconductor use. More specifically, the present invention relates to a graphite component, such as a crucible, having an outer layer of glassy carbon formed from a thermoset organic resin and in which the component is used in the process for producing silicon crystal growth from a molten silicon bath containing dopants. The invention also relates to a method for producing the coated graphite component.

2. Background of the Invention

Generally, polycrystalline silicon rods are made by the pyrolytic decomposition of a gaseous silicon compound, such as silane or a chlorosilane (e.g., trichlorosilane) on a rod-shaped, red-heated starter filament made preferably from a silicon seed rod or, alternatively, from a high-melting point metal having good electrical conductivity such as tungsten or tantalum. The principles of the design of present state-of-the-art reactors for the pyrolysis of silane and chlorosilanes are set forth in, for example, U.S. Pat. Nos. 3,147,141; 4,147,814; and 4,150,168, which are incorporated herein by reference as if set out in full. It is generally more desirable to prepare the polycrystalline silicon rods by silane pyrolysis so as to avoid the complications caused by the formation of chloride by-products when pyrolyzing chlorosilanes.

The pyrolysis of silane to form silicon and hydrogen, or a chlorosilane which produces chloride-containing compounds such as HCl, $SiHCl_2$ or the like as well as hydrogen, is performed in a reactor consisting of a series of heated filaments, generally silicon rods, surrounded by cooled surfaces. Typically, the filaments are heated by introducing an electrical current through the filament. The process is started with the silicon filament at ambient temperature.

The polycrystalline silicon is produced by heterogeneous decomposition of the silane, chlorosilane or mixtures thereof on the glowing hot silicon filament rod. The reaction deposits silicon on the surface of the rod and releases hydrogen gas if the silicon is formed by the decomposition of silane, or hydrogen gas in conjunction with other chloride-containing by-product compounds if the source of silicon is chlorosilane.

One of the major objectives in the production of polycrystalline silicon is to produce a silicon rod which is as pure as possible. Even slight amounts of contaminants have a major impact on the efficacy of the silicon chips which are ultimately made from this precursor polycrystalline silicon. The prior art techniques for making polycrystalline silicon have had the problem of coping with various contaminants, including carbon.

As stated above, the gaseous silicon compound which is used as a source for the silicon, is thermally decomposed by means of a heated starter filament. This filament, typically made of a silicon seed rod, is generally heated by passing an electrical current therethrough. Accordingly, this filament must be held securely in place so as to accommodate the growing polysilicon rod that is being deposited thereon while simultaneously being capable of having an electrical current passed through it. Typically, a graphite chuck has been utilized by the prior art in order to accomplish both of these objectives. The graphite chuck is made so that the starter filament may be securely mounted on it. The chuck can be positioned and seated on an electrode which provides the necessary electrical power for the required current, and, most importantly, the chuck is electrically conductive so as to be able to conduct the current from the electrode to the filament.

Polycrystalline rods are primarily used as precursors for making silicon crystal growth for the semiconductor industry by either the float zone melting process or by the Czochralski crystal pulling technique. These silicon crystal growths or rods are then processed to form silicon wafers from which silicon chips are made for use in the electronic industry.

In the Czochralski process for making silicon crystals, chunks of polycrystalline silicon rods and dopant are melted in a silica lined graphite crucible. Dopants are added to the silicon bath to create the required electrical characteristics and the silicon structure is rearranged to a single crystal form. Heating, such as radio frequency heating, is required to achieve a 1,425° C. melting temperature for the silicon rods. A seed crystal of either [111] or [100] orientation contacts the molten silicon bath and is then slowly raised. The surface tension between the seed and the molten silicon bath causes a small amount of the liquid to rise with the seed. Upon cooling, the atoms in the melt orient themselves to the structure of the seed, repeating the seed orientation in the growing crystal. To achieve doping uniformity and diameter control, the seed and crucible are rotated in opposite directions. In this method of producing crystals four feet long or longer and six inches or more in diameter, it is important to insure that the component parts employed in the formation of the silicon crystal growth do not contaminate the silicon product. Graphite parts, including crucibles, pedestals (shafts) and heaters, are generally used in the Czochralski crystal growth process. It is therefore necessary to protect the silicon crystals from contamination of carbon from these graphite parts. Even though the graphite component is not in direct contact with the molten silicon, there is potential for carbon contamination of the silicon crystals. For example, carbon from the graphite crucible could diffuse into the silica liner which could then be diffused into the silicon bath. Silicon containing vapors formed during the process can also react with the graphite component generating carbon contaminants.

It is an object of the present invention to provide a graphite component, such as a crucible, coated with a glassy carbon layer that will prevent the reaction of the carbon in the component from contaminating the molten silicon bath which could result in impure silicon wafers.

It is another object of the present invention to provide a method for producing a glassy carbon coated graphite component that can be used in the production of substantially carbon-free silicon wafers which in turn can be used to make high quality silicon chips.

The foregoing and additional objects will become more fully apparent from the following description.

SUMMARY OF THE INVENTION

The invention relates to a graphite component, such as a graphite crucible, suitable for use in the production of silicon wafers from a molten silicon bath in which said graphite component has a glassy carbon outer layer formed from a thermoset organic resin and wherein said glassy carbon layer is impervious to gases.

The invention also relates to a method for making a glassy carbon coated carbon component, such as a crucible, comprising the steps:

(a) preparing a carbon component that is intended to be used and exposed to a molten silicon bath;

(b) depositing on said carbon component a layer of a non-graphitizing organic thermosetting resin; and (c) heating the coated carbon component at a temperature and time period sufficient to thermoset the resin and then converting the thermoset resin to glassy carbon by heating to above 500° C. in an inert gas atmosphere or in a halogen gas atmosphere.

In some applications, the component could be a graphite component before depositing the outer layer of resin or the component could be a carbon component that could be graphitized after the outer layer is deposited on the component by heating the resin coated carbon component to the graphitizing temperature such that said temperature would also convert the resin to glassy carbon.

In some applications two or more separate layers of the thermosetting resin may be applied to the graphite component to obtain a desired coating thickness. The glassy carbon coated graphite component, such as a crucible, can then be used in a method for making substantially carbon-free silicon wafers which comprises heating polysilicon chunks and one or more dopant in a crucible to a temperature sufficient to melt the silicon to produce a molten silicon bath; contacting a seed crystal with the surface of the molten silicon bath and then slowly lifting the seed crystal so that a small amount of the molten silicon adheres to the seed; rotating the seed crystal and crucible in opposite directions during the lifting of the seed crystal and then cooling the melt on the seed crystal thereby forming a single silicon crystal growth.

As used herein, glassy carbon is a monolithic non-graphitizable carbon with a very high isotropy of the structure and physical properties and with a very low permeability for gases and liquid. The glassy carbon also has a pseudo-glassy appearance. Glassy carbon can be formed from a non-graphitizing carbon-containing thermosetting resin such as synthetic or natural resins. Thermosetting resins are resins that become rigid on heating and cannot be softened upon reheating. The principal groups of resins suitable for use in this invention are phenolics, urethanes and polymers of furfural and furfuryl alcohol. The preferred phenolics are phenol-formaldehyde and resorcinol-formaldehyde. Furan based polymers derived from furfural or furfuryl alcohol are also suitable for use in this invention. The resin system should preferably give a carbon yield in excess of about 20% and have a viscosity below about 200–300 cps. In addition to solutions of phenolics in furfural and furfuryl alcohol, straight furfural or furfuryl alcohol can be used with a catalyst. For example, a solution of furfural and an acid catalyst could be coated on the surface of the graphite component and then cured and carbonized.

The resin coating of this invention does not require a separate heat treatment step since the resin coating could be carbonized during the regular graphitization of the carbon component. The resin coating may be deposited by any conventional manner such as painting, spraying, dipping, infiltration or the like. The resin can be applied directly onto the graphite component from a resin solution so that uniformity and thickness of the coating can be accurately controlled. For most applications, the thickness of the glassy carbon layer can be from about 0.5 mils to 25 mils, preferably from about 1 mil to 10 mils. The temperature for thermosetting the resin will depend upon the particular resin used to coat the graphite component. For most applications a temperature from 100° C. to 300° C. could be used for a time period from 1 to 10 hours. After thermosetting the resin, the component can be recoated to build up a thicker overall layer and thereby assure more uniformity in the deposited layer. The coated component can then be further heated to convert the thermoset resin to a glassy carbon. The heat treatment to convert the thermoset resin to glassy carbon can preferably be from 500° C. to about 3000° C. depending on the particular composition of the coated layer and component substrate. If the coating is used on a carbon component which has not been graphitized, then it will be necessary to heat treat the coated carbon component to above 2500° C. to convert the carbon component to a graphite component. The coated layer will not be converted to graphite since it is a non-graphitizing carbon resin. If the component is a graphite component then most preferably the thermoset resin can be heated from 500° C. to 2000° C. to convert the resin to glassy carbon. The carbon coated graphite components can also be further purified by a heat treatment in a halogen gas atmosphere at a temperature from about 1400° C. to 1800° C. An added benefit of using an organic resin is that the coated graphite component will be all carbon unlike a silicon carbide coated graphite component. This will result in a component, such as a crucible, having a relatively high electrical conductivity.

The glassy carbon coating that is provided to the outer surface of the graphite component will prevent diffusion of reactant products or by-products of the silicon crystal growth process into the graphite component and substantially eliminate the deposition of carbon from the components of the apparatus into the silicon product. Since glassy carbon is harder than graphite, the glassy carbon coating will also provide protection from flaking, scratching and other defects in the graphite component. As stated above, two or more coatings can be applied to the graphite component to deposit a desired layer of the glassy carbon. Preferably, the outer glassy carbon layer can be applied to completely cover a graphite crucible since the glassy carbon is a relatively good conductor.

BRIEF DESCRIPTION OF THE DRAWINGS

The FIGURE is a cross-sectional diagram of an apparatus for implementing the Czochralski process for making a single silicon crystal growth that is used to make silicon wafers for semiconductor applications.

DETAILED DESCRIPTION OF THE INVENTION

Referring to the FIGURE, a rotatable graphite crucible 10 having a glassy carbon layer 12, is shown having a silica liner 11, and housed within a container 13, such as a graphite container. This graphite crucible 10 is seated on a rotatable shaft 15 and contains a molten silicon bath 14. A rotatable chuck 16 secures a silicon seed crystal 18. The molten silicon bath 14 is heated by graphite heater elements 20 connected to a suitable power source not shown. When the seed crystal 18 contacts the molten bath 14, the surface tension between the seed crystal 18 and molten silicon bath 14 causes a small amount of the silicon bath 22 to rise with the seed crystal 18. Upon cooling, the atoms in the melt orient themselves to the structure of the seed, repeating the seed orientation in the growing crystal. The seed crystal 18 and crucible 10 are rotated in opposite directions to achieve doping uniformity and diameter control of the silicon crystal growth 22. As shown in the FIGURE, a silicon crystal growth 22 can be produced which can then be cut into wafers for semiconductor applications. If desired, the rotatable chuck 16, shaft 15, heater elements 22 and/or container 13 may also be coated with a glassy carbon layer.

EXAMPLE

A graphite crucible of the type shown in the FIGURE was dipped into a 50% solution of a liquid resol phenolic resin in furfural. The properties of the solution were:

Specific Gravity=1.20

Viscosity=20 cps at 22° C.

Modified MCC=27.2%

The graphite crucible was immersed for about 15 minutes in the solution, then removed and allowed to drip-dry in air. The crucible was then cured at 150° C. in argon for an hour. A second dipping was then applied to the crucible following the same procedure as the first dipping.

The coated crucible was then heated to 250° C. in argon and held for an hour at 250° C. to thermoset the resin. The final coated crucible was nonporous as was demonstrated by $H_2O$ immersion (i.e., no bubbling). The coated crucible was then heat treated to 1600° C. at a rate of 250° C. per hour in a nitrogen atmosphere with chlorine gas added at the final stage to effect purification and ash removal.

The glassy carbon coated graphite crucible produced was used in a Czochralski silicon crystal growing process, as described above in conjunction with the FIGURE, to produce a substantially carbon-free silicon crystal.

While the present invention has been described with reference to many particular details thereof, it is not intended that these details shall be construed as limiting the scope of this invention.

What is claimed:

1. A method for making a graphite component having a coating of a completely covering layer of glassy carbon consisting of the following steps:

(a) preparing a graphite component in the form of a crucible for use in the making of single silicon crystal growth from a molten silicon bath contained in the crucible;

(b) immersing said crucible in a liquid non-graphitizing organic thermosetting resin and removing said crucible from said resin thereby depositing on said component a completely covering layer of a non-graphitizing organic thermosetting resin from about 0.5 to 25 mils thick; and (c) heating the component and its deposited liquid resin layer at a temperature and time period sufficient to thermoset the resin layer and further heating the component and its thermoset resin layer in an inert atmosphere or a halogen-containing atmosphere to convert the thermoset resin layer to a glassy carbon nongraphitic coating completely covering said crucible.

* * * * *